US010455692B2

(12) United States Patent
Ziglioli

(10) Patent No.: US 10,455,692 B2
(45) Date of Patent: Oct. 22, 2019

(54) PACKAGED SEMICONDUCTOR DEVICE HAVING A SHIELDING AGAINST ELECTROMAGNETIC INTERFERENCE AND MANUFACTURING PROCESS THEREOF

(71) Applicant: STMICROELECTRONICS S.R.L., Agrate Brianza (IT)

(72) Inventor: Federico Giovanni Ziglioli, Pozzo d'Adda (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/658,165

(22) Filed: Jul. 24, 2017

(65) Prior Publication Data

US 2017/0325329 A1    Nov. 9, 2017

Related U.S. Application Data

(63) Continuation of application No. 14/607,695, filed on Jan. 28, 2015, now Pat. No. 9,736,925.

(30) Foreign Application Priority Data

Jan. 31, 2014   (IT) .............................. TO2014A0076

(51) Int. Cl.
*H01L 23/552*   (2006.01)
*H05K 1/02*   (2006.01)
(Continued)

(52) U.S. Cl.
CPC .......... *H05K 1/0237* (2013.01); *H01L 23/13* (2013.01); *H01L 23/552* (2013.01); *H01L 24/97* (2013.01);
(Continued)

(58) Field of Classification Search
None
See application file for complete search history.

(56) References Cited

U.S. PATENT DOCUMENTS

| 4,670,347 A | 6/1987 | Lasik et al. |
| 5,151,769 A | 9/1992 | Immorlica, Jr. et al. |

(Continued)

FOREIGN PATENT DOCUMENTS

| CN | 102969303 A | 3/2013 |
| JP | 2005-353713 A | 12/2005 |

OTHER PUBLICATIONS

Benton, "Ribbon Bonding," *Advanced Packaging* 8(3):24-26, 1999.
Laird Technologies, "Clip-on Symmetrical Shielding: Fingerstock Gaskets," copyright 2011, 2 pages.

*Primary Examiner* — Xanthia C Cunningham
(74) *Attorney, Agent, or Firm* — Seed Intellectual Property Law Group LLP

(57) ABSTRACT

A packaged device has a die of semiconductor material bonded to a support. An electromagnetic shielding structure surrounds the die and is formed by a grid structure of conductive material extending into the support and an electromagnetic shield, coupled together. A packaging mass embeds both the die and the electromagnetic shield. The electromagnetic shield is formed by a plurality of metal ribbon sections overlying the die and embedded in the packaging mass. Each metal ribbon section has a thickness-to-width ratio between approximately 1:2 and approximately 1:50.

18 Claims, 4 Drawing Sheets

(51) Int. Cl.
  H05K 7/02     (2006.01)
  H01L 23/13    (2006.01)
  H01L 23/00    (2006.01)
  H01L 23/31    (2006.01)
  H01L 21/56    (2006.01)

(52) U.S. Cl.
  CPC .............. *H05K 7/02* (2013.01); *H01L 21/561* (2013.01); *H01L 23/3121* (2013.01); *H01L 24/06* (2013.01); *H01L 24/32* (2013.01); *H01L 24/37* (2013.01); *H01L 24/45* (2013.01); *H01L 24/48* (2013.01); *H01L 24/49* (2013.01); *H01L 24/73* (2013.01); *H01L 24/92* (2013.01); *H01L 2224/04042* (2013.01); *H01L 2224/06135* (2013.01); *H01L 2224/32145* (2013.01); *H01L 2224/32225* (2013.01); *H01L 2224/37124* (2013.01); *H01L 2224/37139* (2013.01); *H01L 2224/37144* (2013.01); *H01L 2224/37624* (2013.01); *H01L 2224/37647* (2013.01); *H01L 2224/45014* (2013.01); *H01L 2224/45032* (2013.01); *H01L 2224/45099* (2013.01); *H01L 2224/45124* (2013.01); *H01L 2224/45139* (2013.01); *H01L 2224/45147* (2013.01); *H01L 2224/48091* (2013.01); *H01L 2224/48137* (2013.01); *H01L 2224/48145* (2013.01); *H01L 2224/48227* (2013.01); *H01L 2224/48235* (2013.01); *H01L 2224/48464* (2013.01); *H01L 2224/49175* (2013.01); *H01L 2224/73265* (2013.01); *H01L 2224/83* (2013.01); *H01L 2224/85* (2013.01); *H01L 2224/92247* (2013.01); *H01L 2224/97* (2013.01); *H01L 2225/0651* (2013.01); *H01L 2225/06506* (2013.01); *H01L 2225/06537* (2013.01); *H01L 2225/06568* (2013.01); *H01L 2924/00* (2013.01); *H01L 2924/00011* (2013.01); *H01L 2924/00012* (2013.01); *H01L 2924/00014* (2013.01); *H01L 2924/01034* (2013.01); *H01L 2924/14* (2013.01); *H01L 2924/1431* (2013.01); *H01L 2924/1433* (2013.01); *H01L 2924/1461* (2013.01); *H01L 2924/15153* (2013.01); *H01L 2924/15311* (2013.01); *H01L 2924/15313* (2013.01); *H01L 2924/19107* (2013.01)

(56) References Cited

U.S. PATENT DOCUMENTS

| | | | |
|---|---|---|---|
| 5,317,107 A * | 5/1994 | Osorio ................. | H01L 23/047 174/377 |
| 5,485,037 A | 1/1996 | Marrs | |
| 6,188,578 B1 | 2/2001 | Lin et al. | |
| 6,348,653 B1 * | 2/2002 | Cho ...................... | H05K 9/0041 174/383 |
| 6,614,102 B1 | 9/2003 | Hoffman et al. | |
| 6,826,053 B2 | 11/2004 | Kato et al. | |
| 7,259,969 B2 * | 8/2007 | Zarganis ............ | H01R 13/6595 361/800 |
| 7,342,303 B1 | 3/2008 | Berry et al. | |
| 7,451,539 B2 | 11/2008 | Morris et al. | |
| 7,573,124 B2 | 8/2009 | Wang et al. | |
| 7,576,415 B2 | 8/2009 | Cha et al. | |
| 7,943,424 B1 | 5/2011 | Wang et al. | |
| 7,960,818 B1 | 6/2011 | Davis et al. | |
| 7,964,938 B2 | 6/2011 | Yoon et al. | |
| 8,071,431 B2 | 12/2011 | Hoang et al. | |
| 8,072,047 B2 | 12/2011 | Camacho et al. | |
| 8,736,033 B1 * | 5/2014 | Chuo ................... | H01L 23/552 257/659 |
| 2002/0130739 A1 * | 9/2002 | Cotton ................. | H05K 1/0218 333/238 |
| 2003/0089983 A1 | 5/2003 | Huang et al. | |
| 2007/0063322 A1 | 3/2007 | Chow et al. | |
| 2008/0111217 A1 * | 5/2008 | Dimaano ............ | H01L 23/4334 257/675 |
| 2009/0067149 A1 | 3/2009 | Bogursky et al. | |
| 2009/0211802 A1 | 8/2009 | Poulsen | |
| 2009/0242264 A1 | 10/2009 | Lei | |
| 2009/0244876 A1 | 10/2009 | Li et al. | |
| 2009/0244878 A1 | 10/2009 | Wurzel et al. | |
| 2009/0273912 A1 | 11/2009 | Myers et al. | |
| 2010/0085719 A1 | 4/2010 | Lu et al. | |
| 2010/0157566 A1 * | 6/2010 | Bogursky ............ | H05K 9/0032 361/816 |
| 2010/0200983 A1 * | 8/2010 | Ono .................... | H01L 23/055 257/708 |
| 2010/0202127 A1 | 8/2010 | Tuominen | |
| 2010/0246143 A1 | 9/2010 | Dinh et al. | |
| 2011/0038136 A1 * | 2/2011 | Carey .................. | H01L 23/552 361/818 |
| 2011/0198737 A1 | 8/2011 | Yao et al. | |
| 2011/0299262 A1 | 12/2011 | Crotty | |
| 2012/0044663 A1 | 2/2012 | Lu et al. | |
| 2012/0113601 A1 | 5/2012 | Kohara | |
| 2012/0193737 A1 | 8/2012 | Pang et al. | |
| 2012/0243191 A1 | 9/2012 | Wu | |
| 2012/0281386 A1 | 11/2012 | Kim | |
| 2012/0327630 A1 | 12/2012 | Feldstein et al. | |
| 2013/0114228 A1 * | 5/2013 | Merz ................... | H05K 1/0218 361/783 |
| 2013/0250540 A1 | 9/2013 | Hou | |
| 2014/0043785 A1 | 2/2014 | Huang et al. | |
| 2014/0071635 A1 | 3/2014 | Werner et al. | |
| 2014/0191385 A1 | 7/2014 | Di-Giacomo | |
| 2014/0286009 A1 | 9/2014 | Hamilton et al. | |
| 2015/0264844 A1 | 9/2015 | Jang et al. | |
| 2015/0267324 A1 | 9/2015 | Agarwal | |
| 2016/0120076 A1 | 4/2016 | Yoshida et al. | |
| 2016/0227679 A1 | 8/2016 | English et al. | |

* cited by examiner

Fig.9

PACKAGED SEMICONDUCTOR DEVICE HAVING A SHIELDING AGAINST ELECTROMAGNETIC INTERFERENCE AND MANUFACTURING PROCESS THEREOF

BACKGROUND

Technical Field

The present disclosure relates to a packaged semiconductor device having a shielding against electromagnetic interference and to the manufacturing process thereof.

Description of the Related Art

As is known, semiconductor devices are generally formed by a die comprising a semiconductor material body overlaid by one or more insulating layers, integrating conductive and/or micromechanical structures. The die is generally packaged in a packaging mass of insulating material, such as resin, that protects it from hostile environments. The die may be bonded to a support, for example a printed-circuit board, or other supporting board, generally of insulating material or formed by a succession of insulating and conductive layers. The die may also be bonded to another die (stacked solution). The packaging mass may surround the die or also part of the support and surround just one die or a plurality of dice, arranged laterally to each other, on top of each other, in contact with each other, or insulated from each other for forming electronic and/or micro-electro-mechanical devices.

The electronic and/or micro-electro-mechanical devices so packaged are generally used in more complex systems and apparatuses for implementation of various functions. For instance, the electronic and/or micro-electro-mechanical devices may form part of portable electronic apparatuses, such as cellphones, smartphones, music-player devices, tablets, portable computers (laptops, netbooks), video cameras, photographic cameras, consoles for videogames or any other portable or fixed apparatus, possibly having remote communication units.

In such situations, electronic and/or micro-electro-mechanical devices that form part of more complex systems may generate electrical or magnetic fields of noise, or conversely, may be disturbed by electrical and/or magnetic fields generated by other electronic devices present in the same apparatus or in apparatuses located nearby. In fact, such electrical and/or magnetic fields may create interference (referred to hereinafter also as electromagnetic interference—EMI) such as to reduce or even jeopardize the performance of sensitive devices. Consequently, it is increasingly desirable (and in some cases imposed by current standards) to provide shielding structures for protection from external devices and/or for reduction of emissions from the device.

Thus, to prevent any mutual interference, it is known to provide shielding structures on or in each packaged device.

A simple known shielding structure consists in providing a cap of conductive material, typically metal, over the die for forming a sort of Faraday's cage (see, for example, U.S. Pat. No. 6,614,102). Another known solution comprises forming a conductive shielding layer on at least a part of the packaging material surrounding the die. The conductive shielding layer, generally of metal, is grounded via contact pads typically formed on the support of the die. The conductive shielding layer may be glued or applied on the packaging mass via microelectronic techniques, such as sputtering, plating, or growth (see, for example, U.S. Pat. Nos. 7,342,303, 7,451,539 and 7,573,124).

The known solutions may, however, be improved. In fact, their implementation may be complex and/or costly, and may involve purposely devised operations and machines.

Furthermore, the shielding may represent a further structure, which, in addition to increasing the manufacturing costs, frequently entails an increase in the thickness or in general in the dimensions of the device. This increase in dimensions contrasts, however, with the present desires for miniaturization of electronic devices, in particular in the case of use in portable and/or complex apparatuses.

BRIEF SUMMARY

One or more embodiments of the present disclosure may provide a device and a process that overcomes the drawbacks of the prior art.

In one embodiment, a shielding may be obtained by bonding a plurality of metal ribbon sections fixed to the die to be shielded. The ribbon sections are bonded to supports, for example a supporting board that also carries one or more dice to be packaged.

The term "ribbon" means here a continuous flat material having (prior to cutting) a length much greater than the width and the thickness. The ribbon section used in the present device has a length greater than the width (for example, between twice and fifty times) and a thickness much smaller than the width (for example, between one half and approximately one fiftieth). In practice, the thickness of the ribbon sections considered here may be considered practically negligible as compared to the other two dimensions.

The ribbon sections may be obtained by cutting a ribbon reel commonly available on the market, for example a ribbon reel of aluminum, gold, silver, or a reel of double-layered ribbon, such as aluminum and copper. The ribbon sections may be bonded at their ends to a grid structure formed in the support of the die to be shielded and forming, together with the ribbon sections, an electromagnetic cage. The ribbon sections may be bonded via punch-welding of a continuous ribbon, using pressure and ultrasound and then cutting the continuous ribbon.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein:

FIG. 9 shows a table of the width and thickness values of commercially available metal ribbons.

DETAILED DESCRIPTION

Figure 1:
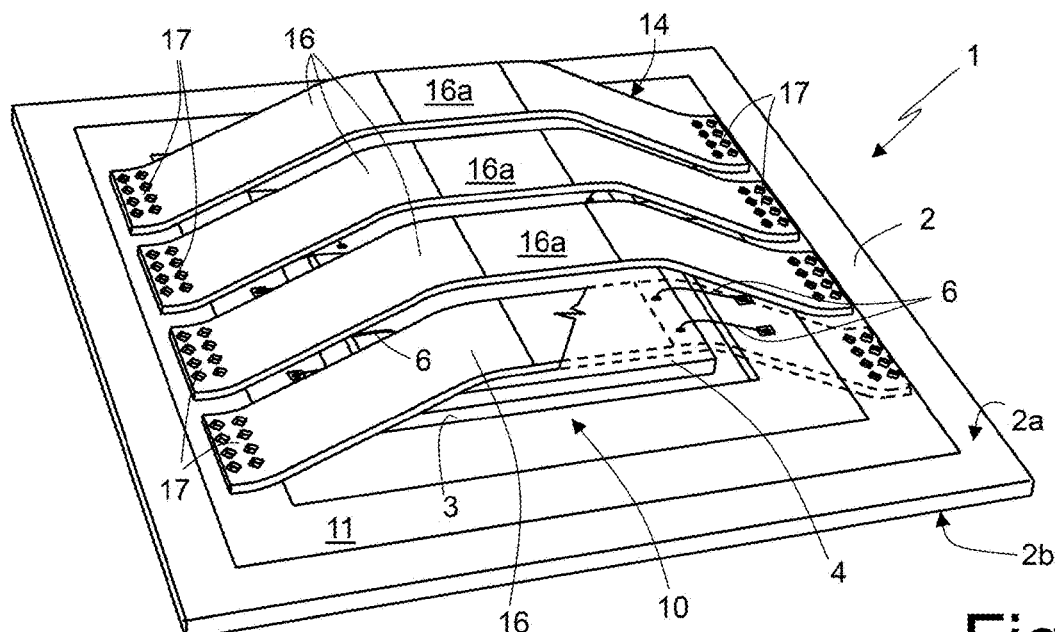
FIG. 1 is a perspective view of an embodiment of the present semiconductor device, prior to forming the packaging mass.
Figure 2:
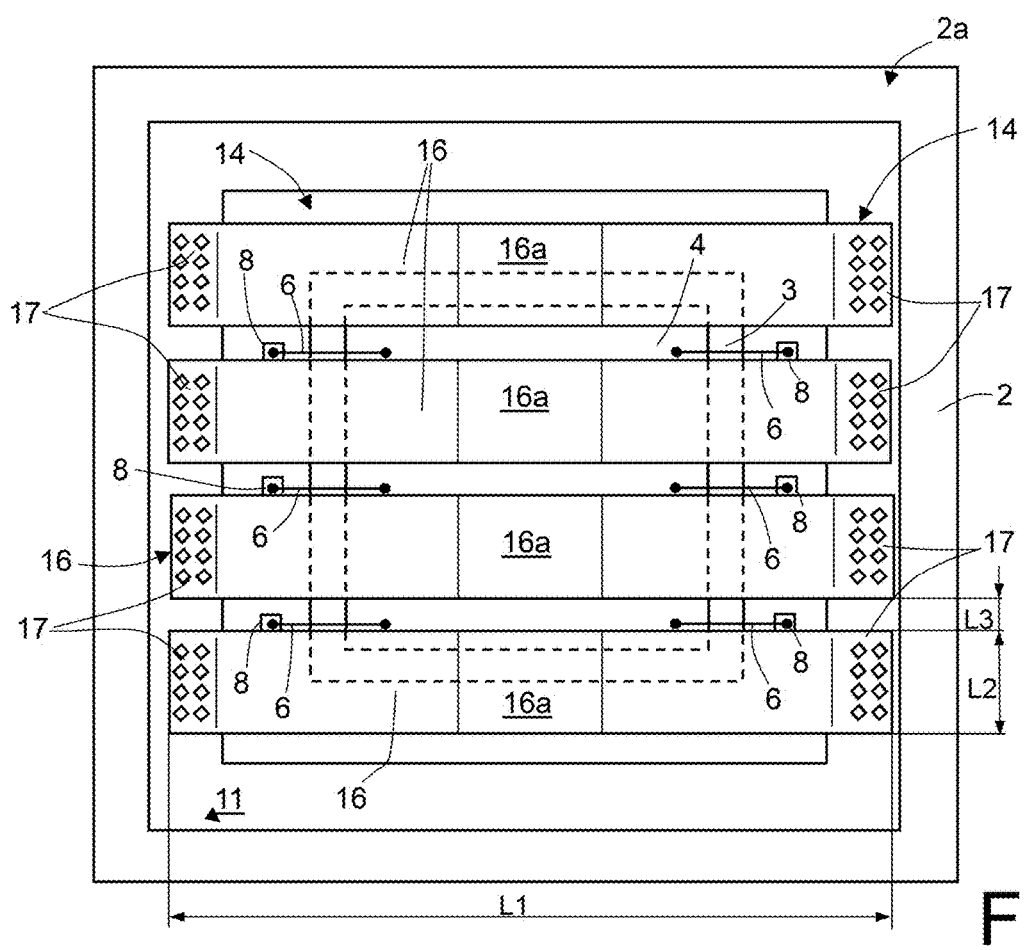
FIG. 2 is a top plan view of the device of FIG. 1.
Figure 3:
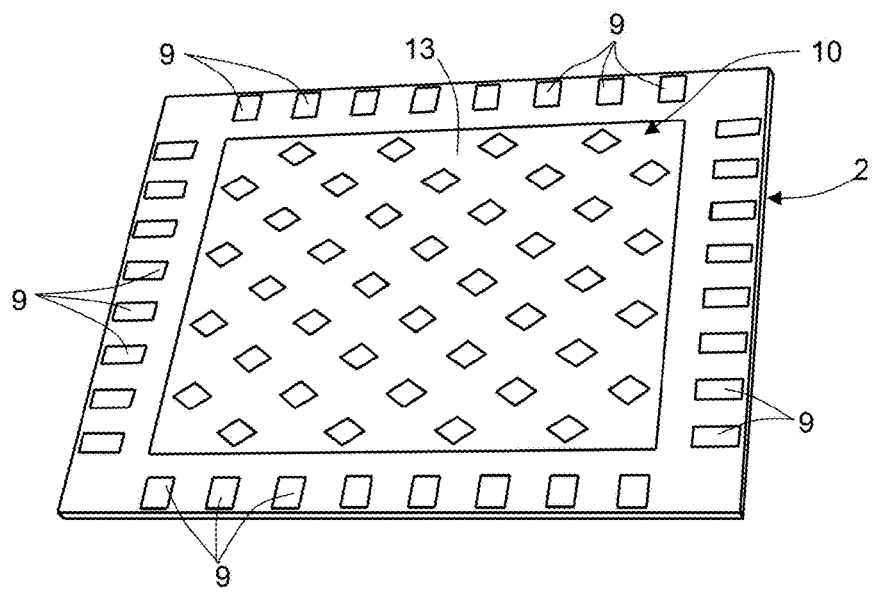
FIG. 3 is a bottom view of the device of FIG. 1.

FIGS. 1-3 show a semiconductor device 1 having a ribbon-type shielding structure, prior to forming the package.

In detail, the device 1 comprises a support 2, for example a printed-circuit board PCB, having a first face (for example, a top face 2a) and a second face (for example a bottom face 2b). The support 2 has a reduced thickness in a central area for forming a cavity 3 facing the top face 2a (see also FIG. 4).

A die 4 is fixed in the cavity 3 and accommodates an integrated electronic circuit or a micro-electro-mechanical device (not illustrated in detail). As may be seen in particular in the dashed line portion of FIG. 1 and in the cross-section of FIG. 4, the die 4 is connected to the outside via wired connections. Consequently, electrical connection wires 6 extend between a top surface 4a of the die 4 and the contact regions 8, facing the top surface 2a of the support 2, in a per se known manner.

The contact regions 8 are arranged around the cavity 3 and are connected to conductive paths (not shown) provided on and/or within the support 2, as well as to through vias (not shown either) that connect the contact regions 8 to contact pads 9 on the bottom face 2b of the support 2. Alternatively, in a way not illustrated, the conductive paths may terminate at pads not shown on the top face 2a of the support 2 and/or wireless connection techniques of a known type, such as surface-mounting, may be used.

A shielding structure or electromagnetic cage 10 surrounds the die 4. The shielding structure 10 comprises a grid 14 formed in the support 2 and a shield 15 overlying the support 2. The grid 14 and the shield 15 are electrically coupled together and grounded.

The grid 14 comprises a peripheral strip 11, vertical regions 12 (FIG. 4) and a base portion 13, all of conductive material, for example metal, such as copper. For instance, if the support is a BGA/LGA (ball-grid array/land-grid array) substrate, the grid 14 may be typically a copper mesh formed on and through the substrate layers. Alternatively, the peripheral strip 11 and the base portion 13 may be formed over the faces 2a, 2b of the support 2.

The peripheral strip 11 extends outward of the contact regions 8 (and thus outward of the die 4). In addition, the peripheral strip 11 faces the top face 2a of the support. In the example shown, in top plan view, the peripheral strip 11 has a quadrangular shape; in particular, it forms the sides of a square.

The vertical regions 12 extend throughout the depth the support 2 between the top face 2a and the bottom face 2b of the substrate 2, and electrically connect the peripheral strip 11 to the base portion 13.

The base portion 13 extends parallel to, and faces, the bottom face 2b of the substrate 2. The base portion 13 may be a continuous region, for example a plate, a non-continuous region with interruptions (as may be seen in the bottom view of FIG. 3), or a mesh.

The conductive paths (not illustrated) that electrically connect the die 4 to the outside and extend between the contact regions 8 and the pads 9 may extend between pairs of vertical regions 12.

The shield 15 is formed by a plurality of metal ribbon sections 16, which extend over the die 4, between opposite points of the peripheral strip 11. In the shown example, the ribbon sections 16 extend between two opposite sides of the quadrangle formed by the peripheral strip 11. The ribbon sections 16 are parallel to each other and spaced apart and are bonded at their ends 17 to the peripheral strip 11.

As mentioned, the term "ribbon sections" 16 indicates sections of a continuous flat material, having a length greater than the width and a thickness much smaller than the other two dimensions, obtained by separation of a continuous reel of ribbon. In particular, each ribbon section 16 may have a width between one half and one tenth of the length, and a thickness of less than one half, for example one tenth or less of the width (for example, in commercially available ribbons, for widths that may be used for the present application, the width is between two and a half times and 40-50 times the nominal thickness of the ribbon).

For instance, each ribbon section 16 may have a length L1 (see also FIG. 2) between 1 and 10 mm, a width L2 between 0.2 and 1 mm, and a thickness S (FIG. 4) between 80 and 100 µm. Furthermore, the ribbon sections 16 may be set at a distance from each other between 0.1 and 0.5 mm.

Figure 9:
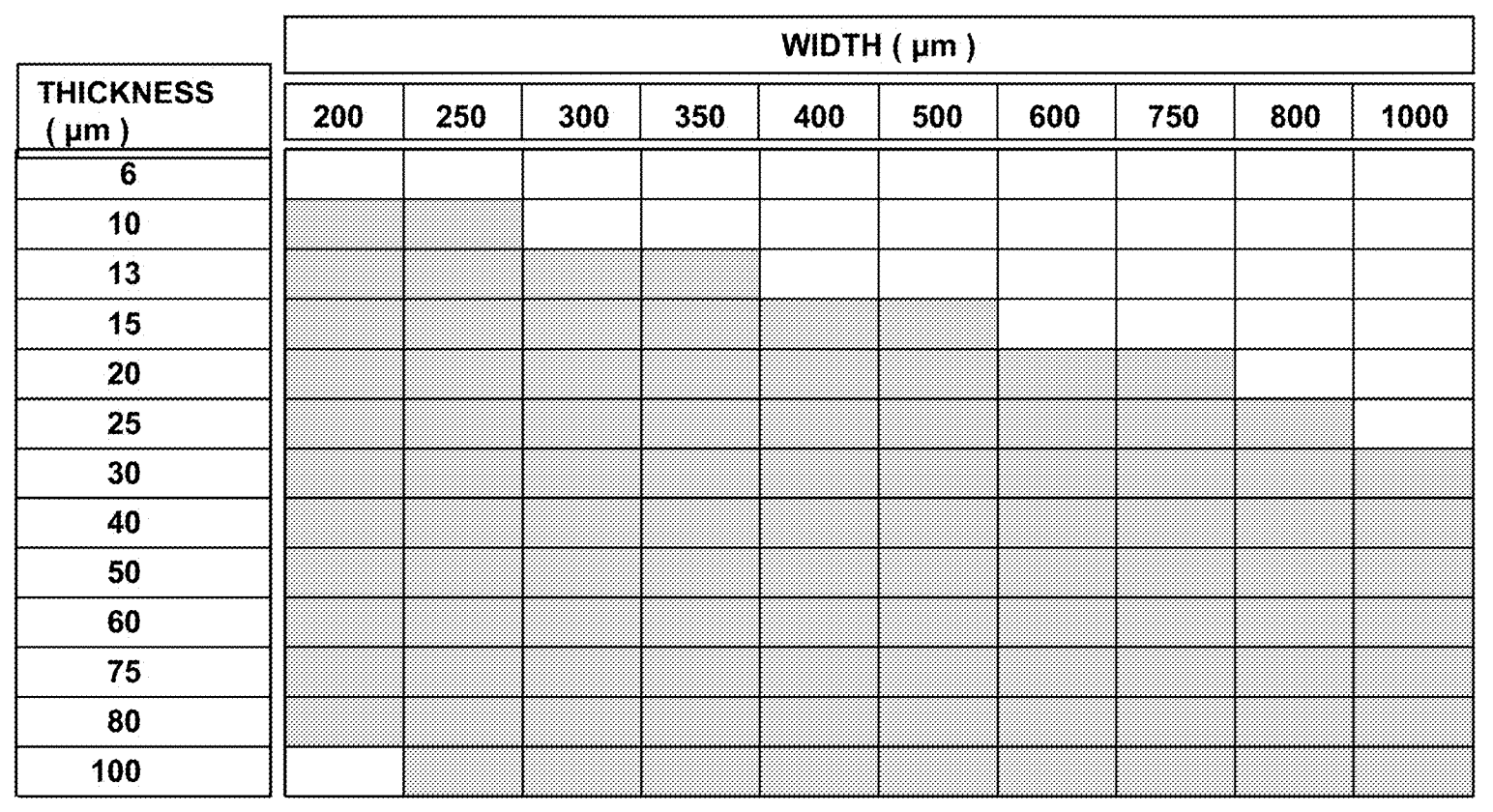

FIG. 9 shows, for example, a table that indicates values of width (on the abscissae) and of thickness (on the ordinates) of commercially available metal ribbons of the type that may be used with the present device. The internal hatched area represents the available values.

With the dimensions indicated above, and on the hypothesis of having a die 4 with a height of 120 µm and a cavity with a depth of 100 µm, the ribbon sections 16 may have a maximum height H in the vertical direction (FIG. 4) between 0.1 and 1.5 mm as measured from the top face of the support 2.

To reduce the overall vertical dimension of the ribbon sections 16, they may have a top central portion 16a that is flattened.

Figure 4:
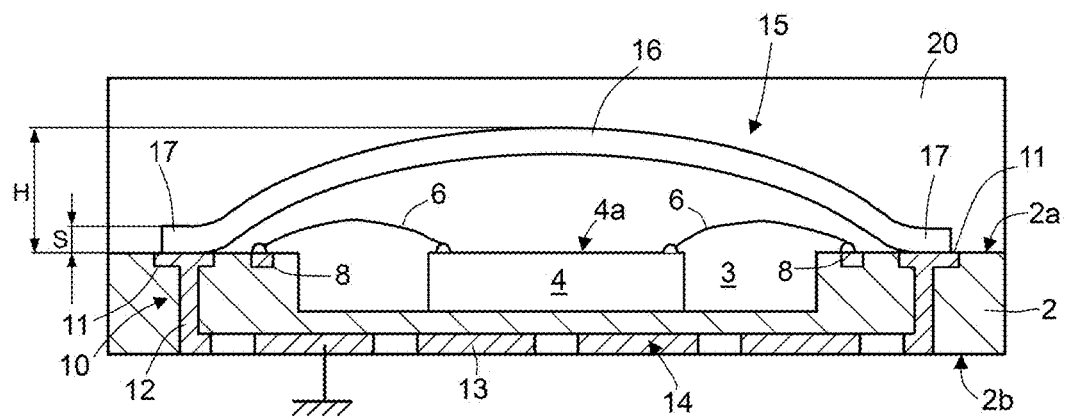
FIG. 4 is a cross-section of the present finished device.

A packaging mass 20 extends over the support 2, covering and embedding the die 4 and the shield 15, as well as the wires 6, filling the cavity 3, as may be seen in FIG. 4. The packaging mass 20, which forms a molded package, is a standard material for molded packages, typically plastic material, such as resin.

Production of the device 1 is described hereinafter.

Initially, the die 4 is manufactured according to usual semiconductor-machining techniques, cut and bonded to the support 2, which is also made in a per se known manner and accommodates the grid structure 14, the contact regions 8, and the contact pads 9. In general, in this step the support 2 is not yet singulated and is joined to other supports to form a supporting panel.

Figure 5:
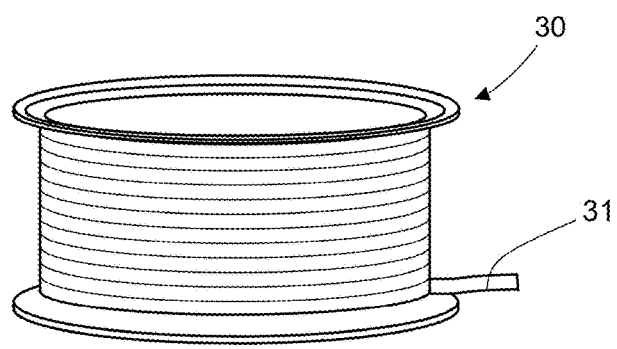
FIG. 5 shows a ribbon reel that may be used for forming the device of FIG. 1.

For each die 4 the wired connections 6 are formed in a per se known manner, and the ribbon sections 16 are bonded to the peripheral strip 11. To this end, a reel 30 of metal ribbon is used, of the type illustrated in FIG. 5. The reel 30 may be of a type commonly available on the market, for example a reel of aluminum, gold or silver ribbon, or a reel of double-layered ribbon, such as aluminum and copper.

Figure 6:
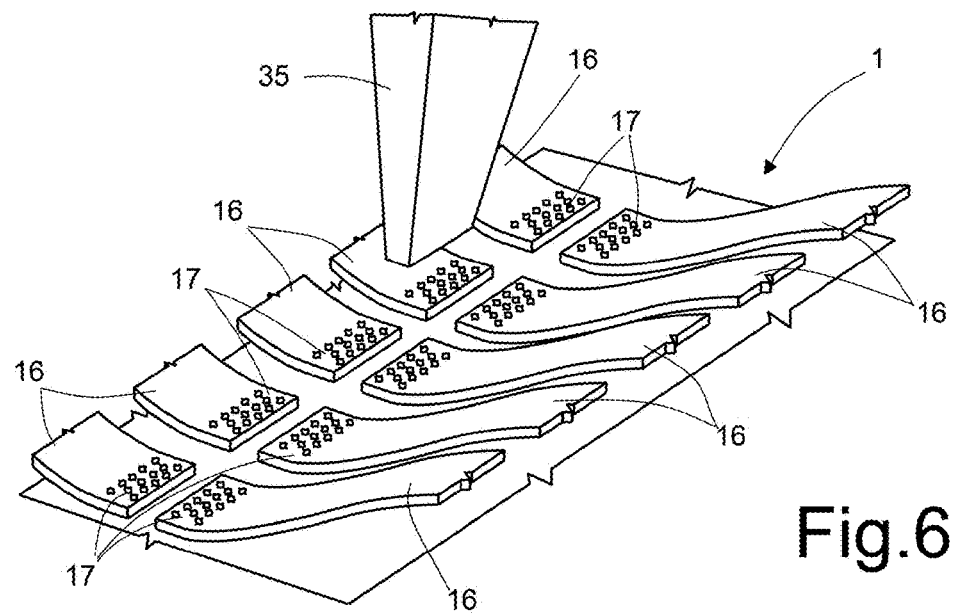
FIG. 6 shows the bonding operation.

One or more continuous ribbons 31 wound off one or more reels 30 are bonded to the respective support 2, individually or in parallel. In particular, for each continuous ribbon 31, after a first end has been bonded to a first side of the peripheral strip 11, the continuous ribbon 31 is passed over the die 4 and bonded on an opposite side of the peripheral strip 11. To this end, it is possible to use a bonding machine (or bonder) of the type used for forming power conductors in integrated devices, which are able to give a particular shape (or loop) on the ribbon section 16 (for example, to obtain the flattened portion 16a of FIG. 1). After bonding of the second end of the continuous ribbon 31, the latter is cut, thus separating the ribbon section 16 just bonded from the rest of the continuous ribbon 31. The process is then repeated for the subsequent dice 4. Bonding may be carried out using a punch, for example as the one designated by 35 in FIG. 6, applying pressure and ultrasound.

For instance, for an aluminum wire having a width of 1 mm and a thickness of 0.1 mm, bonding may be carried out applying a pressure between 0.4 and 0.7 $kg_f$, and for a time interval of 50-90 ms.

In a per se known manner, the packaging mass 20 is molded on the entire panel of supports, and this is cut, to obtain a plurality of finished devices 1, as illustrated in FIG. 4.

Figure 7:
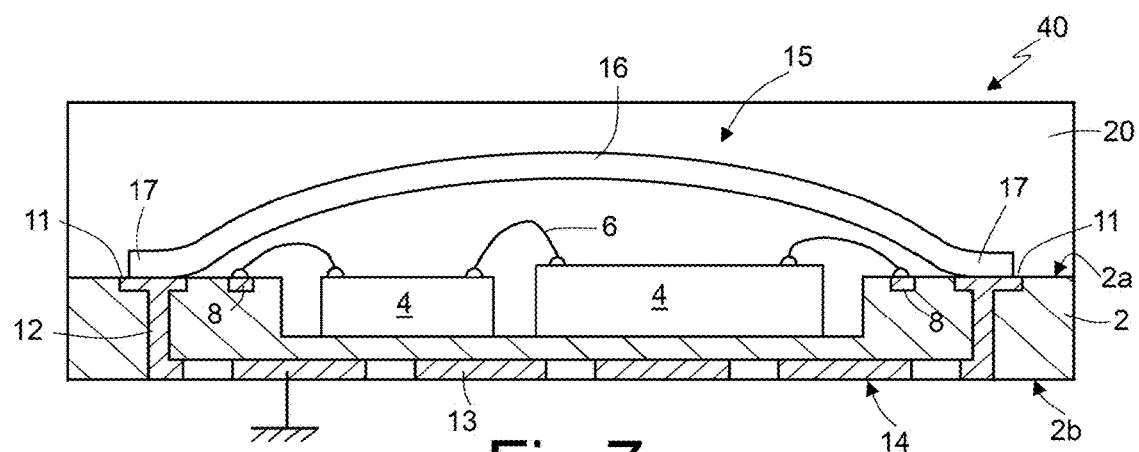
FIGS. 7 and 8 are cross-sections of different embodiments of the present device.

FIG. 7 shows a device 40 having a number of dice 4. In the example shown, two dice 4 (for example, a MEMS sensor and an ASIC integrating a logic for processing the data detected by the MEMS sensor) are arranged near each other, directly bonded to the support 2, within the cavity 3. Electrical connection wires 6 connect the dice 4 together and to the contact pads 8.

Also here, the ribbon sections 16 extend between and are bonded to the peripheral strip 11 and form the shield 15. The packaging mass 20 encloses both of the dice 4, the connection wires 6, and the ribbon sections 16.

Figure 8:
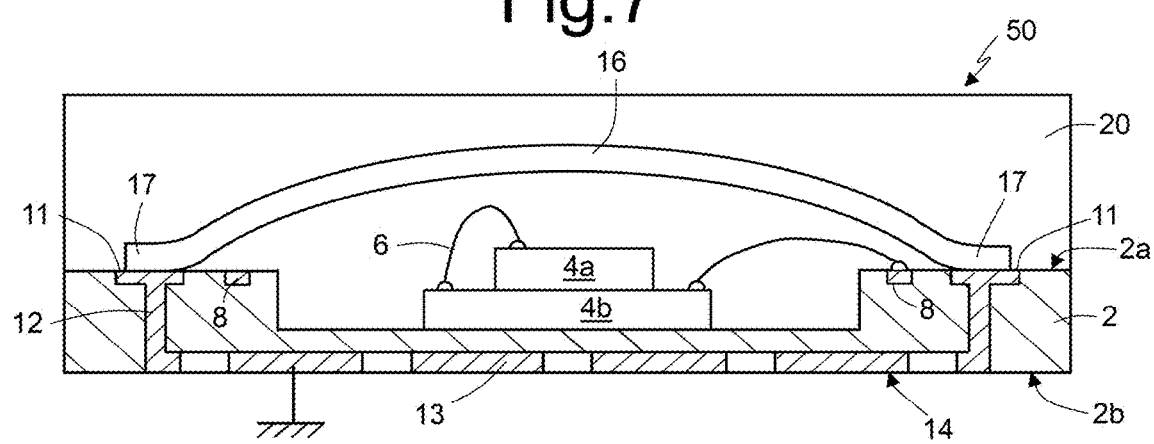

FIG. 8 shows a device 50 wherein a number of dice 4 are arranged in a stacked configuration. In particular, a first die 4a is directly bonded to the support 2 and a second die 4b is arranged on top of, and bonded to, the first die 4a. Electrical connection wires 6 connect the dice 4a, 4b together and the first die 4a to the contact pads 8. For the rest, the device 50 of FIG. 8 is the same as the device 40 of FIG. 7.

The device described herein has numerous advantages.

In particular, it has a shielding structure built within the molded package 20 using standard processing steps in packaging of semiconductor devices.

Additional parts to be produced and/or fixed after packaging are not utilized. Consequently, the shielding does not entail an increase in dimensions, in particular in the thickness, of the finished device.

In particular, steps of plating or sputtering are not utilized to form external metal regions.

Consequently, the costs of production are reduced and the solution may be applied to any type of substrate or lead frame with dedicated layout or design.

Finally, it is clear that modifications and variations may be made to the device and to the manufacturing process described and illustrated herein, without thereby departing from the scope of the present disclosure.

For instance, even though the shield 15 and the ribbon sections 16 have been represented completely embedded in the packaging mass 20, parts of them (for example, the higher central portions 16a) may surface and extend flush with the surface of the package.

The die or dice 4 could be bonded to a flat support not provided with a cavity 3. In this case, the ribbon sections 16 would have a larger curvature.

The peripheral strip 11 might not be continuous, but may be formed by a plurality of regions arranged peripherally; further, it could be formed on the bottom or on the side walls of the cavity 3.

In the case of a multi-die package, the ribbon sections could be bonded also in intermediate areas, for example in areas arranged between the dice. In this case, instead of a single cavity 3, the support 2 could have a plurality of cavities or in any case raised portions that accommodate conductive regions belonging to the grid 14.

Furthermore, intermediate bonding points could be provided also in the case of the single-die solution, and the intermediate bonding points could be obtained directly on the die. Intermediate bonding points could be provided also in the case of a number of dice arranged laterally to each other instead of or in addition to bonding points on raised portions of the support.

The shield could be formed by two pluralities of ribbon sections arranged transverse, for example perpendicular, to each other, where the ribbon sections of one plurality extend over the ribbon sections of the other plurality.

The base region 13 may not be facing the second face of the support 2; for example, it may be provided in a buried conductive layer that extends underneath the die 4.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device comprising:
a support that includes a recess delimited by a base portion and first and second sidewalls;
an interference shield that includes:
a conductive grid having a base in the base portion of the support, the base being exposed at a surface of the support, the conductive grid including a first vertical region in the first sidewall and a second vertical region in the second sidewall, the first and second vertical regions being coupled to the base; and
a ribbon section coupled to the first vertical region at a first end and coupled to the second vertical region at a second end, the ribbon section having a curvature such that a length of the ribbon section is greater than a length of the surface of the conductive grid at the surface of the support, wherein the ribbon section and the conductive grid form an electromagnetic shield; and
a semiconductor die located in the recess and enclosed by the interference shield, wherein the semiconductor die is between the base and the ribbon section, and wherein a portion of the semiconductor die is between the first vertical region and the second vertical region.

2. The device of claim 1 wherein the curvature of the ribbon section extends from the first end to the second end.

3. The device of claim 1 wherein the ribbon section includes a first portion including the first end, a second portion including the second end, and a third portion between the first portion and the second portion, the first and second portions having curvatures and the third portion being planar.

4. The device of claim 1 wherein the ribbon section has a concave side and a convex side, the concave side being closer to the semiconductor die than the convex side.

5. The device of claim 1 wherein the ribbon section includes a first shielding ribbon and a second shielding ribbon.

6. The device of claim 5 wherein the first and second shielding ribbons are spaced apart from and parallel to each other.

7. The device of claim 1 wherein the base is a copper mesh.

8. The device of claim 1, further comprising:
a contact region in the base portion of the support, the semiconductor die electrically coupled to the contact region.

9. The device of claim 1 wherein the support is a printed-circuit board.

10. A method, comprising:
forming a support that includes a recess and a conductive grid around the recess, a surface of the conductive grid being exposed at a surface of the support;
positioning a first semiconductor die in the recess; and
providing a shielding ribbon, wherein the shielding ribbon is coupled to the conductive grid, the shielding ribbon having a length this is greater than a length of the surface of the conductive grid at the surface of the support, the shielding ribbon and the conductive grid forming an electromagnetic shield.

11. The method of claim 10 wherein providing the shielding ribbon includes cutting a reel of ribbon to form ribbon sections and bonding the ribbon sections to the conductive grid.

12. The method of claim 11 wherein bonding the ribbon sections includes applying a bonding force to ends of the ribbon sections via a punch with ultrasound.

13. The method of claim 10, further comprising:
electrically coupling the first semiconductor die to a contact region in the support, the contact region being electrically isolated from the shielding ribbon.

14. The method of claim 10, further comprising:
positioning a second semiconductor die on the first semiconductor die, the second semiconductor die extending from the recess of the support.

15. A device, comprising:
a support including a recess, a conductive grid in the support and around the recess, a surface of the conductive grid being exposed at a surface of the support;
a semiconductor die in the recess and coupled to the support; and
a shielding ribbon coupled to the surface of the conductive grid that is exposed at the surface of the support, the shielding ribbon having a length this is greater than a length of the surface of the conductive grid at the surface of the support, the shielding ribbon and the conductive grid forming an electromagnetic shield.

16. The device of claim 15 wherein the shielding ribbon includes a first shielding ribbon and a second shielding ribbon.

17. The device of claim 16 wherein the first and second shielding ribbons each are spaced apart from and parallel to each other, each shielding ribbon having a thickness-to-width ratio between approximately 1:2 and approximately 1:50.

18. The device of claim 15 wherein the conductive grid is a copper mesh and the support is a printed-circuit board.

* * * * *